(12) United States Patent
Hashiguchi et al.

(10) Patent No.: US 12,540,223 B2
(45) Date of Patent: Feb. 3, 2026

(54) RESIN SURFACE HYDROPHILIZATION METHOD, PLASMA PROCESSING DEVICE, LAMINATE BODY, AND LAMINATE BODY MANUFACTURING METHODRESIN SURFACE HYDROPHILIZATION METHOD, PLASMA PROCESSING DEVICE, LAMINATE BODY, AN LAMINATE BODY MANUFACTURING METHOD

(71) Applicant: komiyama electroc corp., Yamanashi (JP)

(72) Inventors: Haruo Hashiguchi, Yamanashi (JP); Hiroyoshi Kubo, Yamanashi (JP)

(73) Assignee: KOMIYAMA ELECTRON CORP., Yamanashi (JP)

( * ) Notice: Subject to any disclaimer, the term of this patent is extended or adjusted under 35 U.S.C. 154(b) by 289 days.

(21) Appl. No.: 18/352,831

(22) Filed: Jul. 14, 2023

(65) Prior Publication Data

US 2023/0365769 A1    Nov. 16, 2023

Related U.S. Application Data

(62) Division of application No. 17/625,272, filed as application No. PCT/JP2020/030261 on Aug. 6, 2020, now abandoned.

(30) Foreign Application Priority Data

Aug. 10, 2019  (JP) .................................. 2019-148241

(51) Int. Cl.
*H01J 37/32*    (2006.01)
*C08J 7/12*    (2006.01)
(Continued)

(52) U.S. Cl.
CPC ............... *C08J 7/123* (2013.01); *C23C 14/02* (2013.01); *C23C 14/14* (2013.01);
(Continued)

(58) Field of Classification Search
CPC ....... C23C 14/02; C23C 14/14; C23C 14/562; C23C 14/568; C23C 16/02; C23C 16/06;
(Continued)

(56) References Cited

U.S. PATENT DOCUMENTS 5,945,486 A    8/1999  Vargo et al.
6,214,422 B1    4/2001  Yializis
(Continued)

FOREIGN PATENT DOCUMENTS

JP    9-3220 (1997003220    1/1997
JP    2000-80184    3/2000
(Continued)

OTHER PUBLICATIONS

U.S. Final Office Action issued in co-pending parent U.S. Appl. No. 17/625,272 dated Sep. 11, 2023.
(Continued)

*Primary Examiner* — Rodney G McDonald
(74) *Attorney, Agent, or Firm* — STAAS & HALSEY LLP

(57) ABSTRACT

A plasma processing device may include first and second processing devices. The first processing device may include a first chamber, a first exhaust pump which provides, into the first chamber, a first pressure equal to or higher than 0.1 Pa and equal to or lower than 0.3 Pa while depressurizing the first chamber, a first holding unit which holds resin, a first gas introduction unit which introduces, into the first chamber, first gas for desorbing at least a part of atoms constituting the resin from a surface of the resin when turned into plasma, and a first plasma generation unit which turns the
(Continued)

first gas into plasma at the first pressure. The second processing device may include a grounded second chamber, a second exhaust pump which provides, into the second chamber, a second pressure equal to or higher than 30% and equal to or lower than 50% of the first pressure at which the desorption step has been performed while depressurizing the second chamber, a second holding unit which holds the resin processed in the first chamber and to which a first DC voltage may be applied, a second gas introduction unit which introduces, into the second chamber, second gas to generate hydroxyl radicals by being turned into plasma, and a second plasma generation unit which turns the second gas into plasma at the second pressure and to which a second DC voltage higher than the first DC voltage may be applied.

4 Claims, 9 Drawing Sheets

(51) Int. Cl.
*C23C 14/02* (2006.01)
*C23C 14/14* (2006.01)

(52) U.S. Cl.
CPC .. *H01J 37/32366* (2013.01); *H01J 37/32743* (2013.01); *C08J 2327/18* (2013.01); *C08J 2333/06* (2013.01); *H01J 2237/336* (2013.01)

(58) Field of Classification Search
CPC ........... H01J 37/32366; H01J 37/32743; H01J 37/32752; H01J 37/32899; H01J 2237/336; H01J 2237/33; C08J 7/123; C08J 2327/18; C08J 2333/06; C08J 2367/00; H05K 3/1208; H05K 3/146; H05K 3/381; H05K 2203/095; H01L 21/3065
USPC ............................ 118/718, 719; 204/298.24
See application file for complete search history.

(56) References Cited

U.S. PATENT DOCUMENTS

| | | | |
|---|---|---|---|
| 6,550,915 | B1 | 4/2003 | Grobe, III |
| 8,481,607 | B2 | 7/2013 | Aruga et al. |
| 2008/0150177 | A1 | 6/2008 | Hook et al. |

FOREIGN PATENT DOCUMENTS

| | | |
|---|---|---|
| JP | 2001-513832 | 9/2001 |
| JP | 2003-8179 | 1/2003 |
| JP | 2003-201571 | 7/2003 |
| JP | 2008-84820 | 4/2008 |
| JP | 2008-308616 | 12/2008 |
| JP | 2015-124343 | 7/2015 |

OTHER PUBLICATIONS

International Search Report (Form PCT/ISA/210); mailed Nov. 2, 2020 in corresponding International Patent Application No. PCT/JP2020/030261 (4 pages) (3 pages English Translation).
International PCT Written Opinion (Form PCT/ISA/237); mailed Nov. 2, 2020 in corresponding International Patent Application No. PCT/JP2020/030261 (6 pages).
U.S. Non-Final Office Action dated Apr. 17, 2023 issued in U.S. Appl. No. 17/625,272, filed Jan. 6, 2022.
U.S. Appl. No. 17/625,272, filed Jan. 6, 2022, Haruo Hashiguchi et al., Koyima Electron Corp.

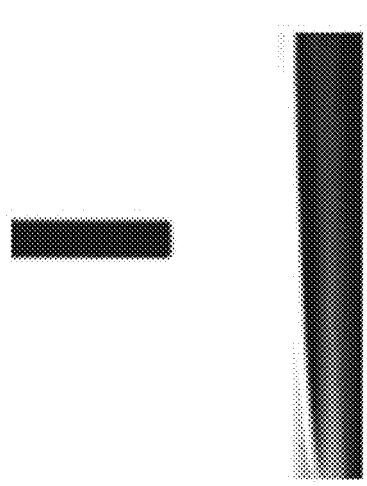
FIG.8A Before processing
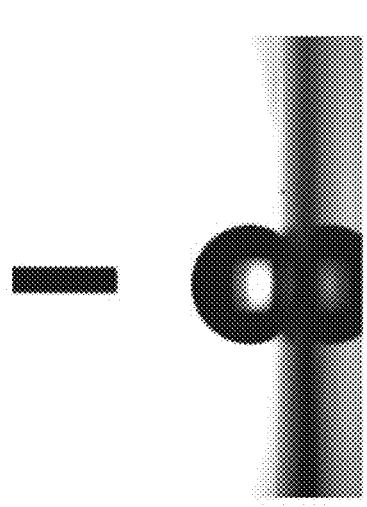
FIG.8B After processing
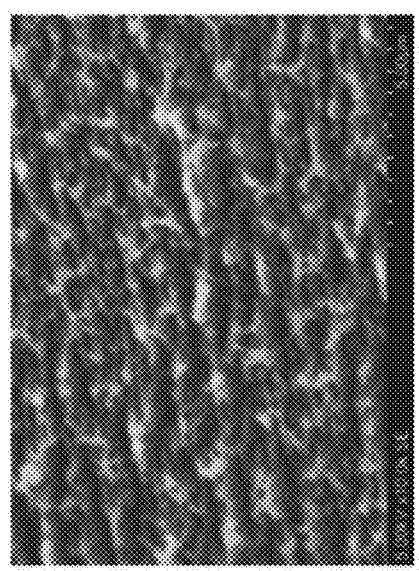
FIG.8C Before processing
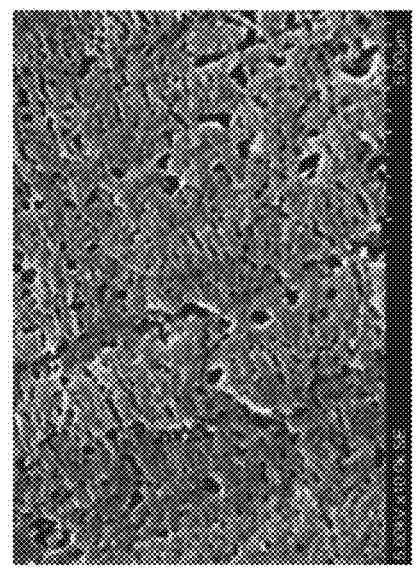
FIG.8D After processing

RESIN SURFACE HYDROPHILIZATION METHOD, PLASMA PROCESSING DEVICE, LAMINATE BODY, AND LAMINATE BODY MANUFACTURING METHODRESIN SURFACE HYDROPHILIZATION METHOD, PLASMA PROCESSING DEVICE, LAMINATE BODY, AN LAMINATE BODY MANUFACTURING METHOD

CROSS-REFERENCE TO RELATED THE APPLICATION

This application is a Divisional application of U.S. patent application Ser. No. 17/625,272, filed Jan. 6, 2022, which is a National Stage application under 35 U.S.C. 371 of PCT International Patent Application No. PCT/JP2020/030261 filed Aug. 6, 2020, which claims foreign priority benefit under 35 U.S.C. § 119 to Japanese Patent Application No. 2019-148241 filed on Aug. 10, 2019 in the Japan Patent Office, the disclosures of all of which are incorporated by reference herein in their entirety.

FIELD

The present application relates to a resin surface hydrophilization method, a plasma processing device, a laminate body, and a laminate body manufacturing method, which are applicable to manufacturing a circuit substrate capable of handling millimeter waves or microwaves with a small transmission loss.

BACKGROUND

As a base member of a circuit substrate, a low-dielectric liquid crystal polymer (LCP) or a low-dielectric fluororesin such as polytetrafluoroethylene (PTFE) has begun to be used instead of conventional polyimide. There is a problem that LCP or PTFE has poor adhesion to copper used as a wire material. For this reason, the surface of the base member of the circuit substrate is chemically roughened, or unevenness is formed on the surface of copper foil which is to be brought into close contact with the substrate, thereby improving the degree of physical adhesion between the substrate and copper.

When copper is formed on the surface of the base member by chemically roughening the surface of the base member, the transmission loss of the circuit substrate increases due to roughness of the surface of the base member. When copper is attached to the surface of the base member using an adhesive, the adhesive layer itself causes transmission loss of the circuit substrate. When copper is formed on the surface of the base member by plating, sufficient adhesion between the base member and copper cannot be obtained. There is also a method of obtaining a laminate body of a PTFE base member and copper by irradiating the PTFE base member with atmospheric plasma to activate the surface thereof, replacing fluorine in the PTFE base member with a hydroxyl group derived from moisture in the air, and bringing copper into close contact with the surface of the PTFE base member.

However, even when the PTFE base member is irradiated with atmospheric plasma, the contact angle of PTFE base member with water is about 50°. Then, when copper is brought into close contact with the surface of the PTFE base member, the degree of adhesion between the PTFE base member and copper is about 0.4 N/mm. Therefore, in the process of producing a circuit pattern of copper on the PTFE base member, there is a fear that copper is peeled off from the PTFE base member. In addition, when heat is applied to the PTFE base member in a circuit-pattern manufacturing process, the degree of adhesion between the PTFE base member and copper further decreases. Further, since the time during which the surface of PTFE base member is modified is about 24 hours, it is necessary to quickly bring copper into close contact with the surface of the PTFE base member, which has been a constraint on manufacturing circuit substrates.

In Patent Document 1, the surface of a base member is cleaned with a high energy beam in a vacuum, and then, the surface of the base member is irradiated with ionized water vapor to adsorb a hydroxyl group on the surface of the base member. However, since the energy of the ionized water vapor is strong, the hydroxyl group once adsorbed is desorbed again from the surface of the base member when the surface of the base member is irradiated with ions of other water vapor. Therefore, the contact angle of the surface of the base member with water is about 40°.

LIST OF DOCUMENTS

Patent Documents

Patent Document 1: Japanese Patent Application Publication No. H9-3220

SUMMARY

Technical Problem

In view of such circumstances, it is an object of the present application to provide a resin surface hydrophilization method for imparting high hydrophilicity to a hydrophobic surface of resin for a long period of time, a plasma processing device capable of performing the resin surface hydrophilization method, a laminate body manufacturing method using the resin surface hydrophilization method, and a laminate body obtained by, for example, the laminate body manufacturing method.

Solution to Problem

A resin surface hydrophilization method of the present application includes a desorption step of desorbing at least a part of atoms constituting resin from a hydrophobic surface of the resin by irradiating the surface with plasma, and an introduction step of introducing a hydroxyl group on the surface of the resin subjected to the desorption step by irradiating the surface of the resin with hydroxyl radicals.

A laminate body manufacturing method of the present application includes a desorption step of desorbing at least a part of atoms constituting resin from a hydrophobic surface of the resin by irradiating the surface with plasma, an introduction step of introducing a hydroxyl group on the surface of the resin subjected to the desorption step by irradiating the surface of the resin with hydroxyl radicals, and a deposition step of depositing a metal film on a surface of the resin subjected to the introduction step.

A plasma processing device of the present application includes a first processing device including a first chamber, a first holding unit which holds resin, a first gas introduction unit which introduces, into the first chamber, first gas for desorbing at least a part of atoms constituting the resin from a surface of the resin when turned into plasma, and a first plasma generation unit which turns the first gas into plasma;

and a second processing device including a grounded second chamber, a second holding unit which holds the resin processed in the first chamber and to which a first DC voltage is applied, a second gas introduction unit which introduces, into the second chamber, second gas which generates hydroxyl radicals by being turned into plasma, and a second plasma generation unit which turns the second gas into plasma and to which a second DC voltage higher than the first DC voltage is applied.

A laminate body of the present application includes a resin base member in which a part of atoms present on a hydrophobic surface of resin is replaced with a hydroxyl group, and a metal deposition film formed on a surface of the resin base member. Here, a contact angle of the surface of the resin base member with water is equal to or smaller than 30°.

Effect of the Invention

According to the resin surface hydrophilization method of the present application, high hydrophilicity can be imparted to a hydrophobic surface of resin for a long period of time. Therefore, a metal film is easily formed on the surface of resin. According to the laminate body manufacturing method of the present application, a laminate body in which a resin base member and a metal deposition film are brought firmly close contact with each other can be obtained. According to the plasma processing device of the present application, the resin surface hydrophilization method of the present application can be easily performed. In the laminate body of the present application, a resin base member and a metal deposition film are brought into firmly close contact with each other.

BRIEF DESCRIPTION OF DRAWINGS

FIGS. 8A to 8D show images when water was dropped on a surface of a substrate before and after processing of an example, and SEM images of the surface of the substrate.

DETAILED DESCRIPTION

Figure 1:
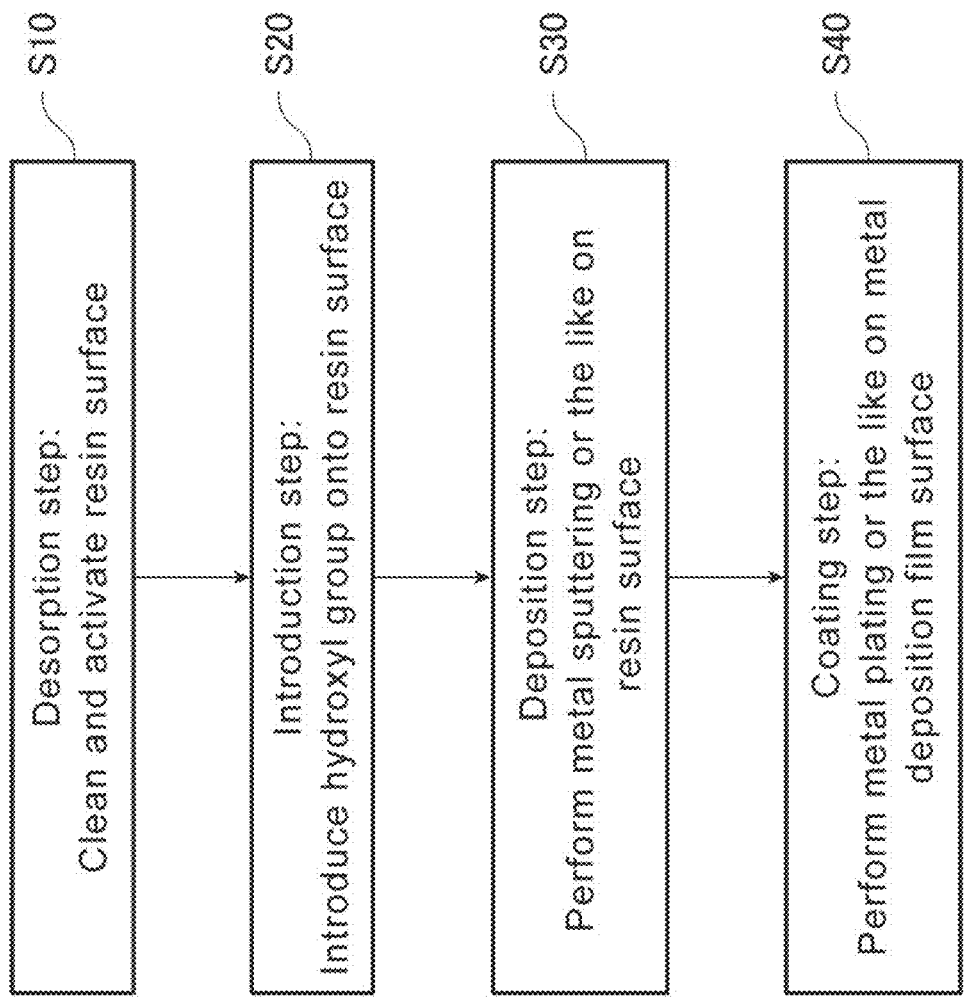
FIG. 1 is a flow of a laminate body manufacturing method.

In order to apply resin to an electronic substrate or the like, it is necessary to hydrophilize a hydrophobic surface of the resin. FIG. 1 shows a flow of each step of a laminate body manufacturing method of the present application. In the laminate body manufacturing method, the first two steps correspond to a resin surface hydrophilization method. That is, the resin surface hydrophilization method of the embodiments of the present application includes a desorption step S10 and an introduction step S20. In the desorption step S10, a hydrophobic surface of resin is irradiated with plasma to desorb at least some of the atoms constituting the resin from the surface of the resin. That is, in the desorption step S10, the hydrophobic surface of the resin is cleaned with the plasma, in particular, with ions in the plasma to activate the surface of the resin.

The resin is not particularly limited as long as it has a hydrophobic surface, and examples thereof include fluororesin such as PTFE, polyimide, and LCP. It is preferable that the resin contains fluorine and carbon and that the atom desorbing from the hydrophobic surface of the resin is fluorine and carbon. This is because the hydrophobic surface of the resin is largely hydrophilized. In addition, the resin containing fluorine has a high insulating property and is excellent as an electronic substrate. The resin may contain wholly aromatic polyester, and the atom desorbing from the hydrophobic surface of the resin may be oxygen. It is preferable that the plasma contains at least one of nitrogen and argon. This is because atoms constituting the resin are easily desorbed from the surface of the resin by ions of nitrogen or argon.

In the introduction step S20, the surface of the resin subjected to the desorption step S10 is irradiated with hydroxyl radicals to introduce a hydroxyl group (—OH) onto the surface of the resin. The surface of the resin into which the hydroxyl group is introduced has high hydrophilicity. For example, water vapor is turned into plasma, and the surface of the resin subjected to the desorption step S10 is irradiated with hydroxyl radicals in the plasma. It is preferable that the desorption step S10 and the introduction step S20 are performed in a reduced pressure state, and that the introduction step S20 is performed after the desorption step S10 while the reduced pressure state is maintained. This is because a hydroxyl group can be introduced into the surface of the resin while maintaining a state in which the surface of the resin is activated in the desorption step S10. The surface of the resin subjected to the introduction step S20 maintains hydrophilicity over a long period of time, for example, one month or more. Therefore, there is no problem even when the resin is opened to the atmosphere after the introduction step S20.

It is preferable that the desorption step S10 is performed at a first pressure equal to or higher than 0.1 Pa and equal to or lower than 0.4 Pa, and the introduction step S20 is performed at a second pressure equal to or higher than 30% and equal to or lower than 50% of the first pressure. This is because, in the desorption step S10, the progress method of ions and radicals in the plasma is easily controlled, and in the introduction step S20, the surface of the resin is hardly irradiated with ions and easily irradiated with hydroxyl radicals. The introduction step S20 is preferably performed at a temperature of the resin being equal to or higher than 150° C. and equal to or lower than 300° C. This is because the chemical reaction between the hydroxyl group and the surface of the resin is promoted, and the hydroxyl group is firmly introduced into the surface of the resin.

When the resin obtained with the resin surface hydrophilization method so far is used for an electronic substrate, it is desirable to attach a metal, for example, copper to the surface of the resin. Therefore, the metal target is irradiated with plasma, ions, or radicals, and the metal ejected from the metal target is thinly deposited on the surface of the resin. That is, the laminate body manufacturing method of the present application includes the desorption step S10, the introduction step S20, and a deposition step S30. In other words, the laminate body manufacturing method of the present application includes the deposition step S30 after the resin surface hydrophilization method of the present application. Since the desorption step S10 and the introduction step S20 are the same as those in the resin surface hydrophilization method of the present application, the description of the desorption step S10 and the introduction step S20 is omitted.

In the deposition step S30, a metal film is deposited on the surface of the resin subjected to the introduction step S20. The deposition of the metal film is performed by, for example, a CVD method or a PVD method (sputtering). Examples of the metal film include a copper film, a silver film, and a gold film. In the deposition step S30, the resin opened to the atmosphere after the introduction step S20 may be used. However, in order to improve productivity and to suppress various contaminants from adhering to the resin, it is preferable to perform the introduction step S20 and the deposition step S30 while maintaining the reduced pressure state.

On the surface of the deposited metal film, plating or thermocompression bonding of the same metal is easily performed. That is, the laminate body manufacturing method of the present application may further include a coating step S40 after the deposition step S30. In the coating step S40, the surface of the deposited metal film is further coated with a metal layer formed of the same metal as the metal forming the metal film. Examples of the method of coating the surface of the metal film with the metal layer include a method in which the metal film and the metal layer of the laminate body subjected to the deposition step S30 are bonded together by thermocompression bonding, and a method in which the metal layer is formed on the metal film of the laminate body subjected to the deposition step S30 by plating.

The laminate body of the embodiments of the present application includes the resin base member in which a part of atoms present on the hydrophobic surface of the resin is replaced with a hydroxyl group, and the metal deposition film formed on the surface of the resin base member. Then, the contact angle of the surface of the resin base member with water is equal to or smaller than 30°. Therefore, the surface of the resin base member and the metal deposition film are brought into firmly close contact with each other. More preferably, the contact angle of the surface of the resin base member with water is equal to or smaller than 10°. The laminate body of the present application may further include, on the surface of the metal deposition film, the metal layer composed of the same metal as the metal forming the metal deposition film. The resin may be polytetrafluoroethylene, and the atom replaced with a hydroxyl group may be fluorine. Further, the resin may be liquid crystal polymer containing wholly aromatic polyester.

Figure 2:
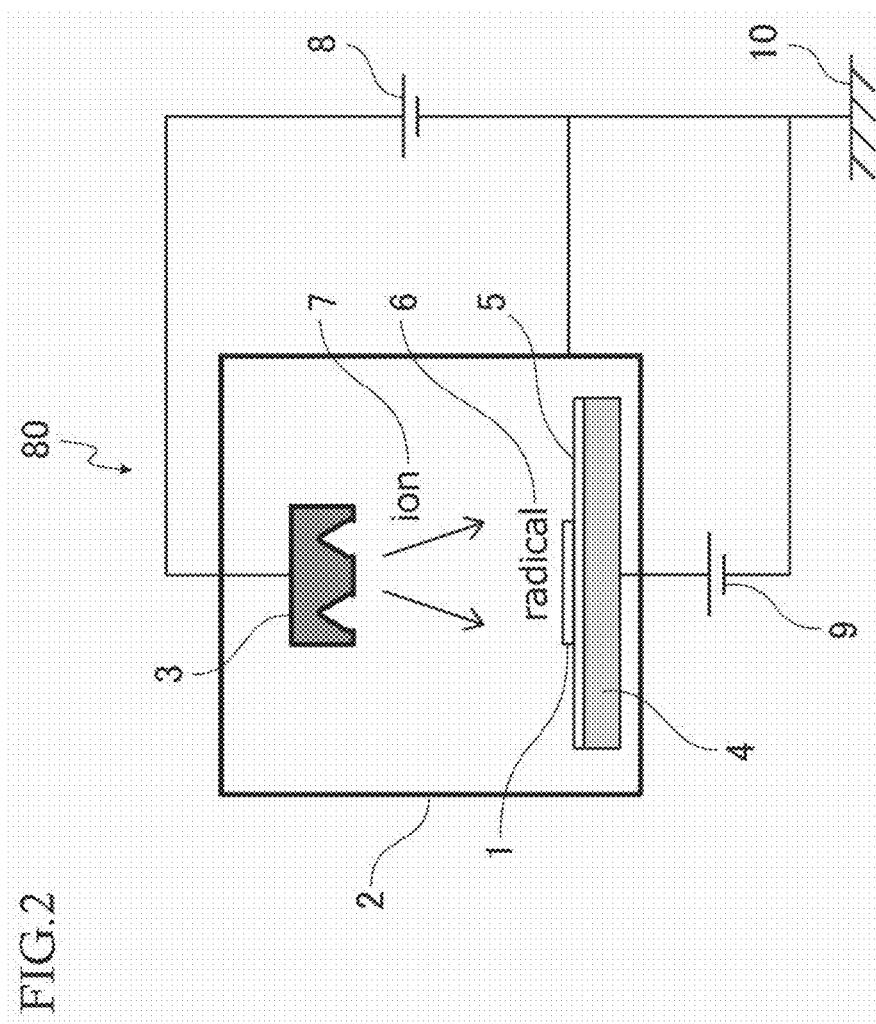
FIG. 2 is a schematic cross-sectional view showing a basic configuration of a processing device.

FIG. 2 shows the basic configuration of a processing device 80 which can be used in the resin surface hydrophilization method of the present application. The processing device 80 includes a vacuum chamber 2, a fine plasma gun (FPG) 3 as the "plasma irradiation source", a holding base 4, a cover 5, a first DC power source 9, and a second DC power source 8. The vacuum chamber 2 is made of a metal such as aluminum alloy or stainless steel and is connected to the ground 10. The FPG 3 is arranged at the upper part in the vacuum chamber 2. The FPG 3 turns processing gas introduced into the vacuum chamber 2 from a gas introduction unit (not shown) into plasma.

As the FPG 3, for example, one described in International Publication No. 2014/175702 can be adopted. The holding base 4 is installed below the FPG 3 to face the FPG 3. The holding base 4 is made of metal or an electrode, and holds a to-be-processed member 1. The cover 5 covers the upper surface of the holding base 4. The cover 5 is made of the same material as the to-be-processed member 1 so that the to-be-processed member 1 is uniformly irradiated with the plasma from the FPG 3. The first DC power source 9 is connected to the holding base 4. The second DC power source 8 is connected to the FPG 3.

The processing gas such as nitrogen, argon, oxygen, and water vapor is introduced into the vacuum chamber 2 from the gas introduction unit while depressurizing the vacuum chamber 2 by an exhaust pump (not shown), thereby adjusting the pressure in the vacuum chamber 2 to a predetermined value, for example, 0.3 Pa being in a range between 0.1 Pa and 0.4 Pa both inclusive. In this state, when a second DC voltage is applied to the FPG 3 from the second DC power source 8, the plasma is generated from the processing gas in the FPG 3.

At this time, if the pressure in the vacuum chamber 2 is too high, for example, when the pressure exceeds 0.4 Pa, the processing gas becomes into a glow discharge state, and the travel direction of ions 7 and radicals 6 in the plasma cannot be controlled. On the other hand, when the pressure in the vacuum chamber 2 is within an appropriate range, a dark discharge state of the processing gas can be maintained, and the travel direction of the ions 7 and the radicals 6 can be controlled. Therefore, the pressure in the vacuum chamber 2 is adjusted to, for example, a pressure equal to or higher than 0.1 Pa and equal to or lower than 0.4 Pa.

When the desorption step S10 is performed using the processing device 80, the desorption step S10 is performed as the following procedure. First, the to-be-processed member 1 made of resin is held by the holding base 4, nitrogen and/or argon as the processing gas is introduced into the vacuum chamber 2 from the gas introduction unit, and the pressure in the vacuum chamber 2 is adjusted to 0.3 Pa being in a range between 0.1 Pa and 0.4 Pa both inclusive by the exhaust pump. Next, the second DC power source 8 is turned on while the first DC power source 9 is kept off, that is, while the holding base 4 is grounded.

The plasma is generated from the processing gas in the FPG 3, and the to-be-processed member 1 is irradiated with the directional ions and radicals. Then, atoms are desorbed from the surface of the to-be-processed member 1 mainly by the impact of the ions. Since the ions and radicals are directional, atoms can be efficiently desorbed from the surface of the to-be-processed member 1. Most of the desorbed atoms are discharged to the outside of the vacuum chamber 2 by the exhaust pump. Some of the desorbed atoms float in the vacuum chamber 2 or adhere to an inner wall of the vacuum chamber 2 or a component in the vacuum chamber 2 after floating. However, in the present embodiment, since the pressure in the vacuum chamber 2 is lower than that in a general glow discharge condition, there is almost no impurity floating in the vacuum chamber 2. Therefore, contamination of the to-be-processed member 1 is suppressed.

When the desorption step S10 is performed using the processing device 80, if the voltage of the second DC power source 8 is increased, a larger amount of the plasma is generated from the processing gas and the desorption of atoms from the surface of the to-be-processed member 1 is promoted. However, when the processing is performed at a high voltage at one time, the wrinkled wall shown in the photograph of FIG. 8B grows too much and the unevenness becomes large. Large unevenness is undesirable to cause increasing of the transmission loss of the electronic substrate. In the present invention, the voltage of the second DC power source 8 is changed with time. Since the unevenness is not formed at the beginning of the desorption step S10, processing is performed at a high voltage to have an increased desorption amount. By processing at a high voltage, contaminants adhering to the surface of the to-be-processed member 1 can also be preferably removed at once. When wrinkles are formed and unevenness is generated, the voltage is lowered and mild processing is performed so that the surface roughness is not deteriorated. Although residual stress is generated on the surface by the processing, the residual stress can be suppressed by mild processing in which the voltage is lowered in the latter half process.

When the introduction step S20 is performed using the processing device 80, the introduction step S20 is performed as the following procedure. Note that the desorption step S10 and the introduction step S20 are preferably performed by separate processing devices 80. This is because when the introduction step S20 is performed in the same processing device 80 as the processing device 80 in which the desorption step S10 has been performed, that is, when the introduction step S20 is performed after the desorption step S10 in the same processing device 80, components desorbed from the surface of the to-be-processed member 1 in the first desorption step S10 may adhere to the inside of the vacuum chamber 2, and in the subsequent introduction step S20, the adhering substances may float and adhere to the surface of the to-be-processed member 1. If there is no influence of the floating substances derived from the desorption step S10, the desorption step S10 and the introduction step S20 may be performed in the same processing device 80

First, the to-be-processed member 1 subjected to the desorption step S10 is held by the holding base 4. It is preferable that the to-be-processed member 1 is moved from the processing device 80 in which the desorption step S10 is performed to the processing device 80 in which the introduction step S20 is to be performed without being opened to the atmosphere, for example, by providing a vacuum preliminary chamber between the two processing devices 80. Next, the processing gas containing water and/or water vapor is introduced into the vacuum chamber 2 from the gas introduction unit. It is preferable that the processing gas is water vapor. This is because hydroxyl radicals are easily generated as the radicals 6.

Then, the pressure in the vacuum chamber 2 is adjusted by the exhaust pump so that the pressure in the vacuum chamber 2 becomes equal to or higher than 30% and equal to or lower than 50% of the pressure in the desorption step S10. Since the pressure in the introduction step S20 is equal to or higher than 30% and equal to or lower than 50% of the pressure in the desorption step S10, a large amount of hydroxyl radicals are generated as the radicals 6 in the plasma from the processing gas. Next, the first DC power source 9 and the second DC power source 8 are turned on. The plasma is generated from the processing gas by a potential difference between the FPG 3 and the grounded vacuum chamber 2.

At this time, the voltage from the first DC power source 9 is preferably smaller than the voltage from the second DC power source 8, and is more preferably smaller than the voltage from the second DC power source 8 as being equal to or higher than 40% of the voltage from the second DC power source 8. This is because, by reducing the potential difference between the FPG 3 and the holding base 4, a large amount of hydroxyl radicals can be extracted as the radicals 6 from the plasma from the processing gas and the to-be-processed member 1 can be irradiated therewith. That is, since the vacuum chamber 2 is grounded, the potential difference between the FPG 3 and the vacuum chamber 2 is larger than the potential difference between the FPG 3 and the holding base 4. Accordingly, most of the ions 7 in the plasma from the processing gas move not in the direction from FPG 3 to the holding base 4 but in the direction from the FPG 3 to the vacuum chamber 2. The to-be-processed member 1 is irradiated with the hydroxyl radicals as the radicals 6, which have no polarity in the remaining plasma.

Owing to that the to-be-processed member 1 is irradiated with the hydroxyl radicals as the radicals 6, the hydroxyl group is introduced into the surface of the to-be-processed member 1. In addition, since the to-be-processed member 1 is hardly irradiated with the ions 7, it is possible to suppress the hydroxyl group introduced into the surface of the to-be-processed member 1 by the impact of the ions from being desorbed again. Thus, stable hydrophilicity is imparted to the surface of the to-be-processed member 1. By introducing the hydroxyl group, the hydroxyl group is chemically bonded to the surface of the to-be-processed member 1.

Figure 3:
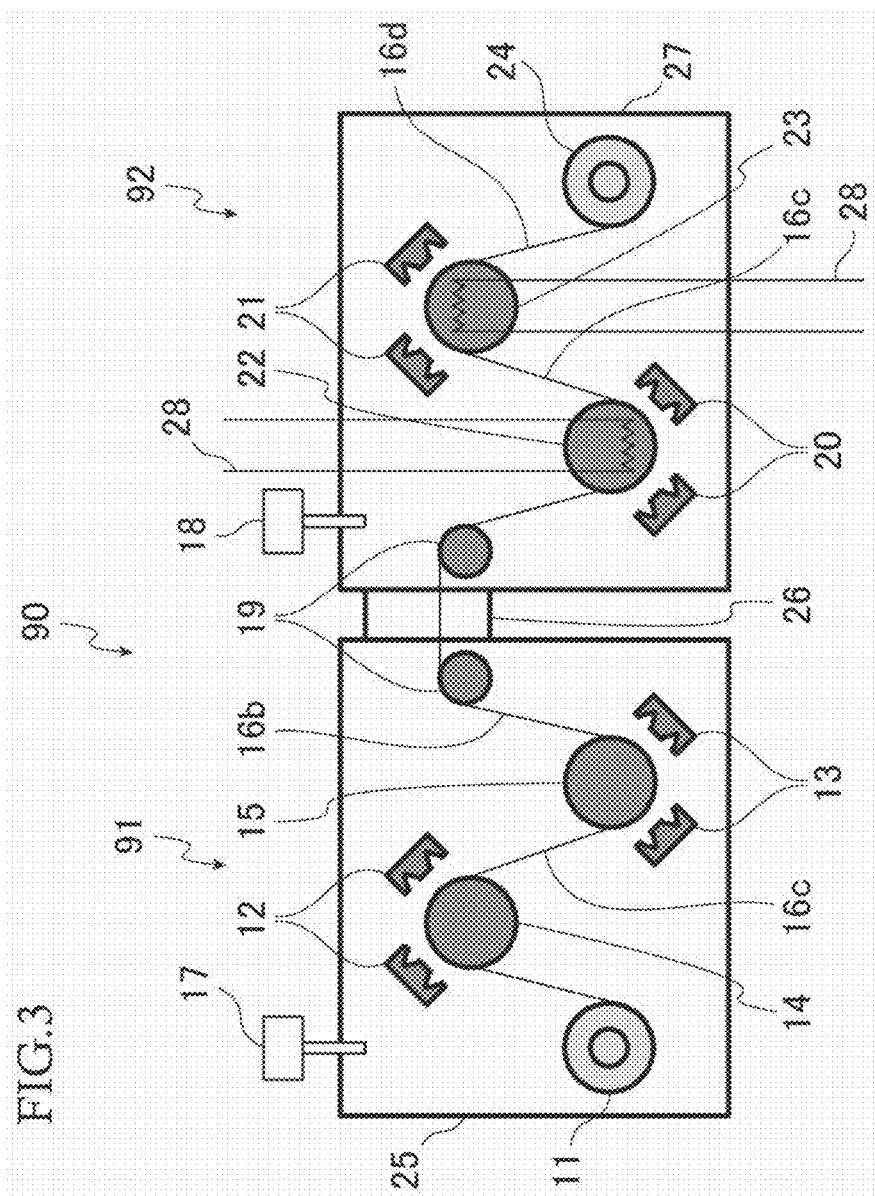
FIG. 3 is a schematic cross-sectional view of a plasma processing device according to a first embodiment.

FIG. 3 schematically shows a plasma processing device 90 of the first embodiment of the present application. In the first embodiment, the to-be-processed member is a sheet-like resin. The plasma processing device 90 includes a first processing device 91 and a second processing device 92. The first processing device 91 for performing the desorption step S10 includes a first chamber 25, a supply roller 11, first holding units 14, 15, a first gas introduction unit 17, and FPGs 12, 13 as a "first plasma generation unit" and a "plasma irradiation source."

The supply roller 11 is wound with a sheet-like resin having a hydrophobic surface, and supplies the resin to the first holding units 14, 15 while rotating. The resin supplied from the supply roller 11 is held while being wound around a part of the cylindrical first holding units 14, 15. The FPGs 12 are arranged so as to face the first holding unit 14. The FPGs 13 are arranged so as to face the first holding unit 15. With such an arrangement of the first holding units 14, 15 and the FPGs 12, 13, the desorption step S10 can be performed on both surfaces of the resin in the first processing device 91. Further, since two FPGs are arranged for one first holding unit, the desorption step S10 can be efficiently performed.

The first gas introduction unit 17 introduces first gas to desorb, when turned into plasma, at least some of the atoms constituting the resin from the surface of the resin into the first chamber 25. In other words, when the first gas is turned into plasma, ions and radicals having directionality in the plasma act on the surface of the resin, so that at least some of the atoms constituting the resin is desorbed from the surface of the resin. In the first embodiment, the first gas is nitrogen and/or argon.

A voltage is applied to each of the FPGs 12, 13 from a power source (not shown) to cause the first gas to turn into plasma. No voltage is applied to the first holding units 14, 15. That is, the first holding units 14, 15 are grounded. A plasma generating means in the first plasma generation unit is not particularly limited. The first plasma generation unit may generate plasma by being applied with an AC voltage. The pressure in the first chamber 25 is about 0.3 Pa at which dark discharge can be maintained.

In the desorption step S10, if the voltage of the FPGs 12, 13 is increased, a larger amount of the plasma is generated from the processing gas and the desorption of atoms from the surface of the to-be-processed member 1 is promoted. However, when the processing is performed at a high voltage at one time, the wrinkled wall shown in the photograph of FIG. 8B grows too much and the unevenness becomes large. Large unevenness is undesirable to cause increasing of the transmission loss of the electronic substrate. In the present invention, the levels of the voltages to be applied to the respective FPGs 12, 13 are set based on the order in which the sheet of the to-be-processed member 1 is irradiated with the plasma. More specifically, among the two FPGs 12 as well as among the two FPGs 13, a difference is provided between the voltage to be applied to the FPG antecedently performing irradiation onto the sheet of the to-be-processed member 1 and the voltage to be applied to the FPG subsequently performing irradiation onto the sheet. The levels of the voltages to be applied to the respective FPGs 12, 13 are set based on the order in which the to-be-processed member 1 is irradiated with plasma.

For example, in FIG. 3, for the FPGs 12, 13 causing the sheet of the to-be-processed member 1 to be antecedently irradiated with the plasma (i.e., the FPG 12 and the FPG 13 each located on the left side in FIG. 3), since unevenness is not formed at the start of the desorption step, the voltage to be applied thereto is set to a high voltage. By processing at a high voltage, contaminants adhering to the surface can also be preferably removed at once. On the other hand, for the FPGs 12, 13 causing the sheet of the to-be-processed member 1 to be subsequently irradiated with the plasma (i.e., the FPG 12 and the FPG 13 each located on the right side in FIG. 3), since unevenness is formed due to the generated wrinkles, a voltage lower than that for the FPGs 12, 13 causing the sheet to be antecedently irradiated with the plasma (i.e., the FPG 12 and the FPG 13 each located on the left side in FIG. 3) is applied thereto so that mild processing is performed. Although residual stress is generated on the surface by the processing, owing to that the mild processing is performed due to plasma irradiation onto the to-be-processed member 1 by the FPGs 12, 13 causing the subsequent plasma irradiation (the FPGs 12, 13 each located on the right side in FIG. 3), it is also possible to suppress the residual stress.

A resin 16a having passed through the first holding unit 14 has one surface processed. Thereafter, when the resin 16a passes through the first holding unit 15, a resin 16b having both surfaces processed is obtained. The resin 16b having both surfaces processed is wound around a part of the guide roller 19. When the resin is fluororesin such as PTFE, both surfaces of the resin 16b are activated by desorption of fluorine and/or carbon. When the resin is wholly aromatic polyester, both surfaces of the resin 16b are activated by desorption of oxygen. The resin 16b is supplied via the guide roller 19 into a second chamber 27 of the second processing device 92 which performs the introduction step S20 in a state in which both surfaces thereof are activated.

A connection portion 26 provided with differential exhaust is arranged between the first chamber 25 and the second chamber 27. The differential exhaust separates the first chamber 25 and the second chamber 27 and the pressure in the first chamber 25 and the pressure in the second chamber 27 can be set different. As described above, since the desorption step S10 and the introduction step S20 are continuously performed by separately using the first processing device 91 and the second processing device 92, high productivity can be ensured.

The second processing device 92 for performing the introduction step S20 includes the second chamber 27, second holding units 22, 23, a second gas introduction unit 18, and FPGs 20, 21 as the "second plasma generating unit" and the "plasma irradiation source." The second chamber 27 is grounded. The second holding units 22, 23 hold the resin 16b processed in the first chamber 25, and a first DC voltage is applied from a power source (not shown). Each of the second holding units 22, 23 include a heater 28 serving as a heating unit. The temperature of the second holding units 22, 23 is preferably maintained at a temperature equal to or higher than 150° C. and equal to or lower than 300° C. by the heaters 28. This is because a hydroxyl group can be efficiently introduced into the surface of the resin 16b.

The second gas introduction unit 18 introduces, into the second chamber 27, a second gas which is turned into plasma to generate hydroxyl radicals. In the first embodiment, the second gas is water vapor. The FPGs 20, 21 turn the second gas into plasma, and a second DC voltage higher than the first DC voltage is applied from a power source (not shown). For example, the first DC voltage is equal to or larger than 40% and equal to or lower than 99% of the second DC voltage. The resin 16b supplied from the first chamber 25 is held while being wound around a part of the cylindrical second holding units 22, 23.

The FPGs 20 are arranged so as to face the second holding unit 22. The FPGs 21 are arranged so as to face the second holding unit 23. With such an arrangement of the second holding units 22, 23 and the FPGs 20, 21, the introduction step S20 can be performed on both surfaces of the resin in the second processing device 92. Further, since two FPGs are arranged for one second holding unit, the introduction step S20 can be efficiently performed. In order to facilitate the introduction of a hydroxyl group into the surfaces of the resin 16b in the introduction step S20, the pressure in the second chamber 27 is preferably equal to or higher than 30% and equal to or lower than 50% of the pressure in the first chamber 25.

At the potential difference between the FPGs 20, 21 and the second chamber 27, plasma of the second gas is generated and ions such as hydrogen ions and hydroxyl radicals are generated. A resin 16c having passed through the second holding unit 22 is hydrophilized on one surface thereof. A resin 16d having passed through the second holding unit 23 is hydrophilized on both surfaces thereof. The resin 16d is wound to a winding roller 24. After the surfaces of all the resin are hydrophilized, the second chamber 27 is opened to the atmosphere and the resin 16d is taken out.

Figure 4:
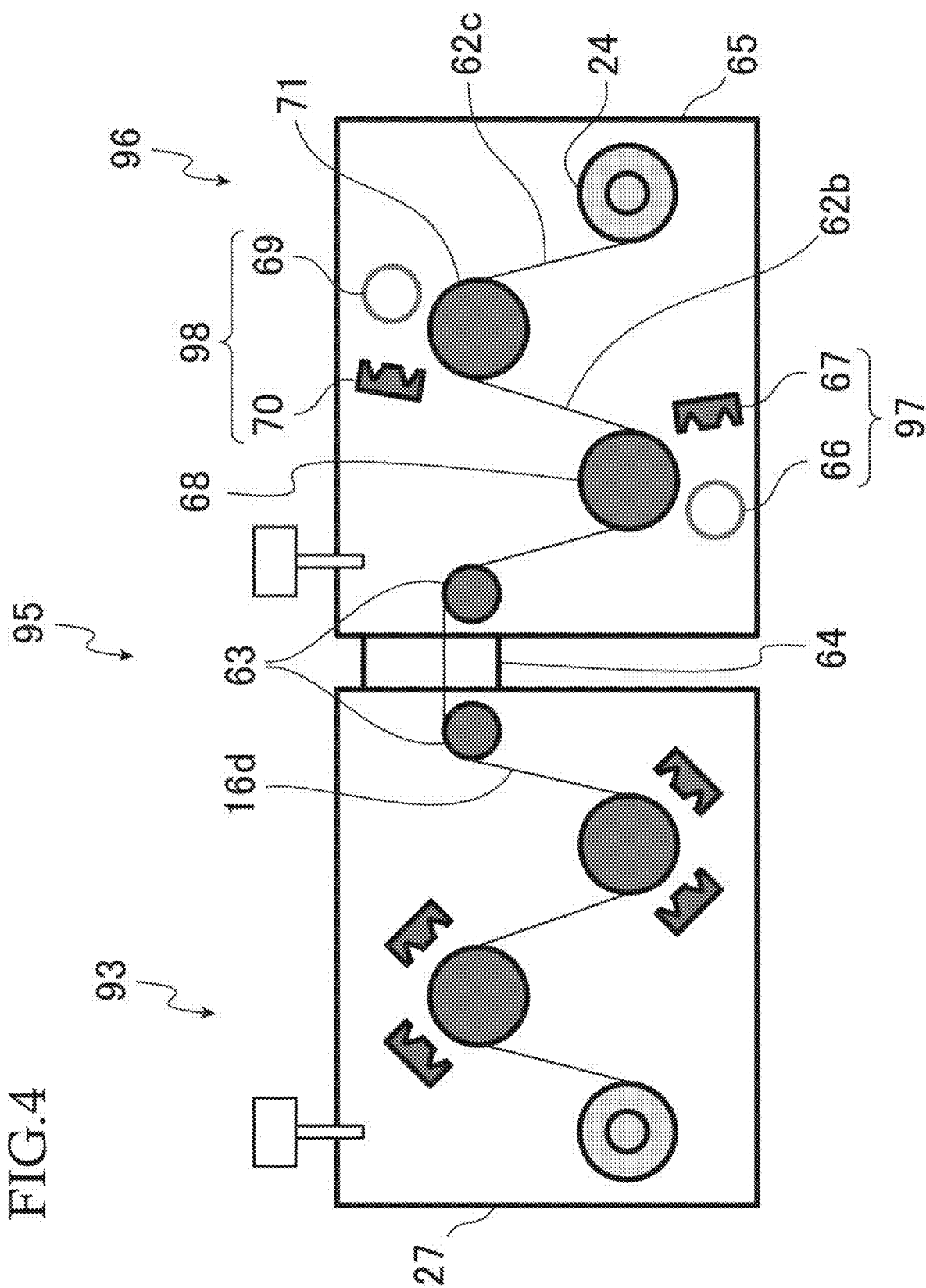
FIG. 4 is a schematic cross-sectional view of the plasma processing device according to a second embodiment.

FIG. 4 schematically shows a plasma processing device 95 of a second embodiment of the present application. The plasma processing device 95 includes a first processing device (not shown), a second processing device 93, and a third processing device 96 which performs the deposition step S30. The second processing device 93 is substantially the same as the second processing device 92. The third processing device 96 includes a third chamber 65, third holding units 68, 71, and metal deposition units 97 98. The third holding units 68, 71 hold the resin 16d processed in the second chamber 27.

Each of the metal deposition units 97, 98 deposits metal on a corresponding surface of the resin 16d held by the third holding units 68, 71. The metal deposition unit 97 includes an FPG 67 as the "plasma irradiation source" and a copper target 66 serving as a metal target. That is, an ion beam emitted from the FPG 67 collides with the copper target 66, and copper ejected from the copper target 66 is deposited on one surface of the resin 16d to form a copper deposition film. The thickness of the copper deposition film is equal to or larger than 10 nm and equal to or smaller than 400 nm. Further, the metal deposition unit 98 includes an FPG 70 as the "plasma irradiation source" and a copper target 69.

The resin 16d subjected to the introduction step S20 in the second chamber 27 is supplied into the third chamber 65 via the guide roller 63. A connection portion 64 provided with differential exhaust is arranged between the second chamber 27 and the third chamber 65. The resin 16d supplied into the third chamber 65 is held while being wound around a part of the cylindrical third holding units 68, 71. When the resin 16d passes through the third holding unit 68, a laminate body 62b in which the copper deposition film is formed on one surface of the resin 16d is obtained.

Thereafter, when the laminate body 62b passes through the third holding unit 71, a laminate body 62c in which the copper deposition films are formed on both sides of the resin 16d is obtained. The laminate body 62c is wound to the winding roller 24. After the copper deposition films are formed on both surfaces of all the resin 16d, the third chamber 65 is opened to the atmosphere and the laminate body 62c is taken out. It is preferable that the processes from the desorption step S10 to the deposition step S30 are continuously performed under reduced pressure.

Since ions in the plasma of the second gas collide with the inner wall of the second chamber 27 of the first embodiment and the vicinity thereof, metals contained in the inner wall and components installed inside the second chamber 27 float from the inner wall of the second chamber 27 and the components. Some of the floating metal may adhere to the resins 16b, 16c, 16d. Therefore, it is preferable that at least a part of the inner wall of the second chamber 27, the FPGs 20, 21 serving as the plasma generation unit, and the components installed in the second chamber 27, to be in contact with the plasma, is made of the same metal as that to be deposited in the third processing device, for example, copper, gold, or silver. This is because the metal deposited by the third processing apparatus is the same as at least a part of the inner wall of the second chamber 27, the FPGs 20, 21, and the components installed in the second chamber 27, so as not to be defective even when the metal floating from the inner wall of the second chamber 27, the FPGs 20, 21, and the components installed in the second chamber 27 adheres to the resins 16b, 16c, 16d.

Figure 5:
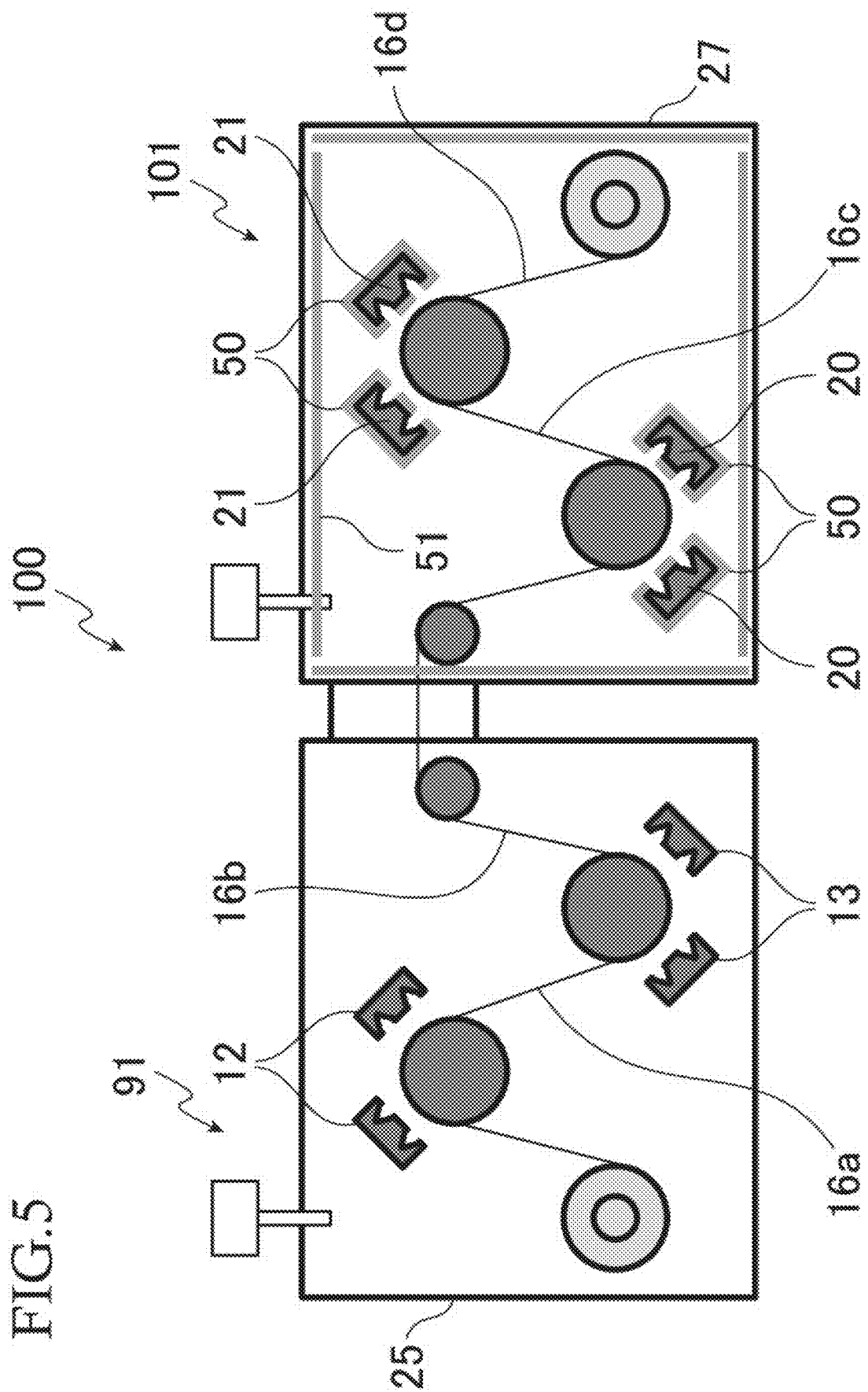
FIG. 5 is a schematic cross-sectional view of the plasma processing device according to a third embodiment.

Further, as in a plasma processing device 100 of a third embodiment shown in FIG. 5, sheets 50, 51 made of the same metal as the metal to be deposited by the third processing device may be arranged as a shielding portion for covering at least a part of the inner wall of the second chamber 27 of the second processing device 101 and the components installed in the second chamber 27, for example, the FPGs 20, 21. Since the metal deposited by the third processing device is the same as the metal forming the sheets 50, 51, it is prevented from being defective even when the metal floating from the sheets 50, 51 adheres to the resins 16b, 16c, 16d.

Figure 6:
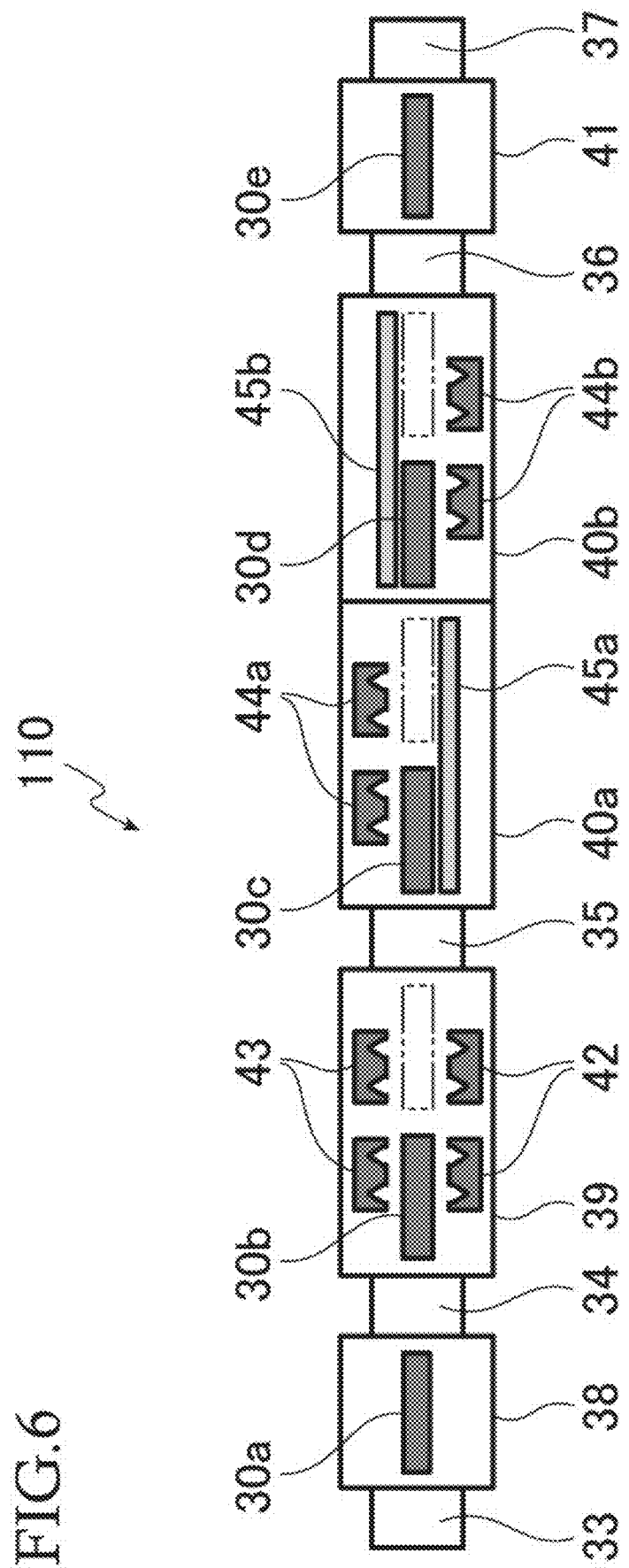
FIG. 6 is a schematic vertical cross-sectional view of the plasma processing device according to a fourth embodiment.
Figure 7:
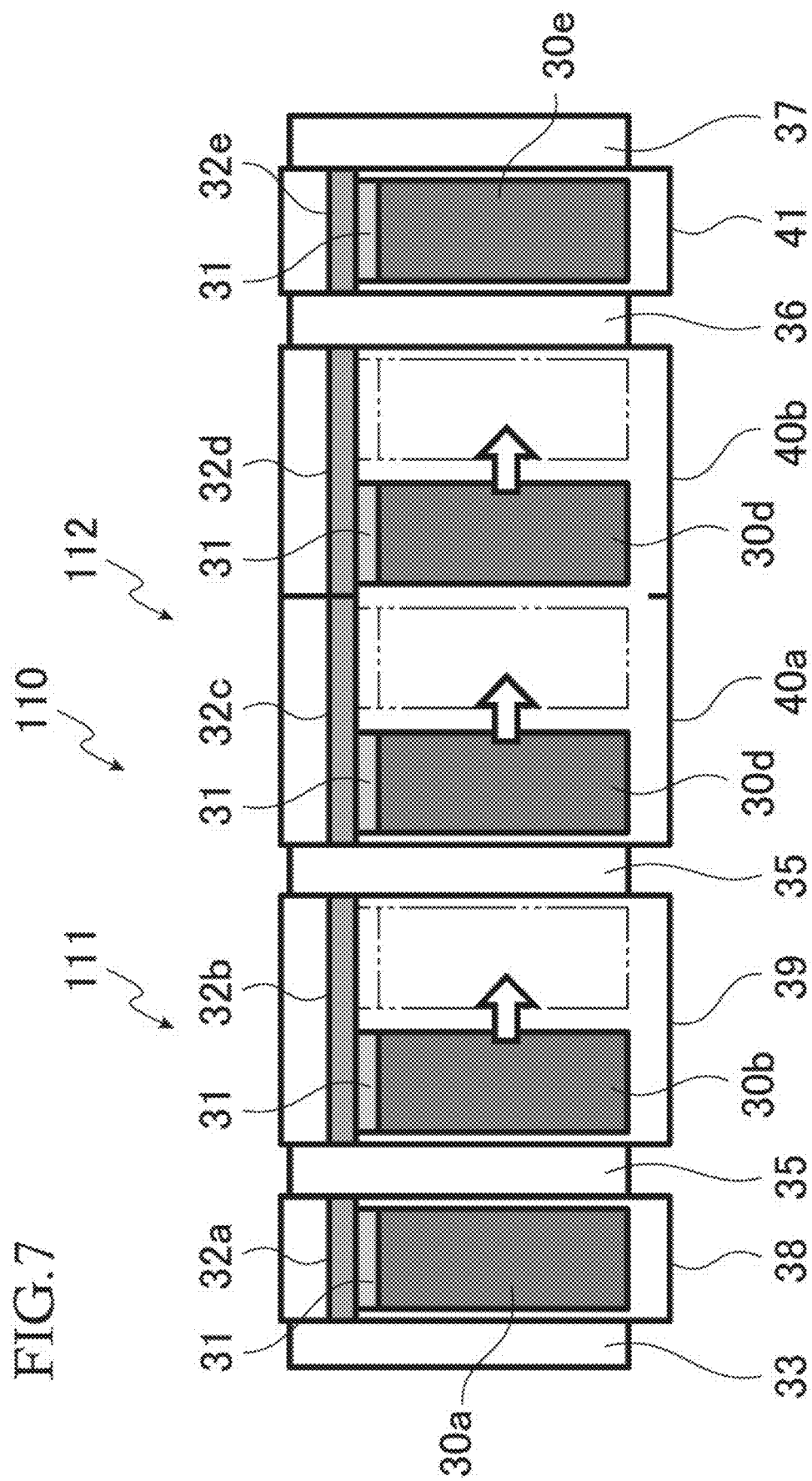
FIG. 7 is a schematic horizontal cross-sectional view of the plasma processing device according to the fourth embodiment.

FIGS. 6 and 7 schematically show a plasma processing device 110 of a fourth embodiment of the present application. In the fourth embodiment, the to-be-processed member is a resin 30a in the form of a sheet-like piece. The plasma processing device 110 includes vacuum preliminary chambers 38, 41, a first processing chamber 111 for performing the desorption step S10, a second processing chamber 112 for performing the introduction step S20, and gate valves 33, 34, 35, 36, 37. The first processing chamber 111 includes a first chamber 39. The second processing chamber 112 includes second chambers 40a, 40b.

As shown in FIG. 7, a movable portion 31 for holding the resin 30a at the end thereof and a raceway portion 32a for mounting and conveying the movable portion 31 are arranged in the vacuum preliminary chamber 38. Similarly, a raceway portion 32b for conveying the movable portion 31 holding the resin 30b is arranged in the first chamber 39. Further, a raceway portion 32c for conveying the movable portion 31 holding the resin 30c is arranged in the second chamber 40a. Further, a raceway portion 32d for conveying the movable portion 31 holding the resin 30d is arranged in the second chamber 40b. Further, a raceway portion 32e for conveying the movable portion 31 holding the resin 30e is arranged in the vacuum preliminary chamber 41. A linear guide, a rack-and-pinion, or the like can be adopted as a conveying method for the resins 30a, 30b, 30c, 30d, 30e.

The plasma processing device 110 is operated as follows. The gate valve 33 is opened, and the movable portion 31 holding the end part of the resin 30a is mounted on the raceway portion 32a in the vacuum preliminary chamber 38. The gate valve 33 is closed to reduce the pressure in the vacuum preliminary chamber 38. When the pressure in the vacuum preliminary chamber 38 becomes equal to or lower than 10 Pa, the gate valve 34 is opened. The movable portion 31 is moved into the first chamber 39 and the gate valve 34 is closed. Using the FPGs 42, 43 as the "plasma irradiation source", the desorption step S10 is performed on the resin 30b in the first chamber 39 to obtain the resin 30c having both surfaces thereof activated. At this time, the resin 30b can be efficiently and homogeneously processed while using two pairs of the FPGs 42, 43.

When the desorption step S10 is completed, the resin 30c, that is, the movable portion 31 moves to the position in front of the gate valve 35. The gate valve 35 is opened to move the movable portion 31 into the second chamber 40a and the gate valve 35 is closed. In the second chamber 40a, the introduction step S20 is performed on the upper surface of the resin 30c to obtain the resin 30d. The resin 30d, that is, the movable portion 31 moves to the position in front of the second chamber 40b. In the second chamber 40b, the introduction step S20 is performed on the lower surface of the resin 30d to obtain the resin 30e. At this time, the voltage applied to an electrode plate 45a is larger than the voltage of the grounded second chamber 40a and smaller than the voltage applied to the FPG 44a as the "plasma radiation source." At this time, the voltage applied to an electrode plate 45b is larger than the voltage of the grounded second chamber 40b and smaller than the voltage applied to the FPG 44b as the "plasma radiation source."

Accordingly, most of the ions in the plasma from the processing gas move not in the direction from the FPGs 44a, 44b to the electrode plates 45a, 45b but in the direction from the FPGs 44a, 44b to the second chambers 40a, 40b. The resins 30c, 30d are irradiated with the remaining hydroxyl radicals in the plasma. The resin 30e, that is, the movable portion 31 moves to the position in front of the gate valve 36. The gate valve 36 is opened, the movable portion 31 is moved into the vacuum preliminary chamber 41, and the gate valve 36 is closed. After the pressure in the vacuum preliminary chamber 41 is made atmospheric, the gate valve 37 is opened to take out the resin 30e.

EXAMPLES (Desorption Step)

In a grounded stainless steel chamber, fine plasma guns (FPG) (linear type ion beam source FPG-L040S manufactured by Finesolution Co., Ltd.) (the same applies hereinafter) were used to perform the desorption step on a commercially available A4-grade fluororesin substrate under the conditions that the pressure in the chamber was 0.3 Pa, the electric power supplied to the FPG was 300 W, and the processing gas was nitrogen or argon.

(Introduction Step)

In a grounded stainless steel chamber, fine plasma guns (FPG) were used to perform the introduction step on the substrate subjected to the desorption step while the voltage applied to the holding base holding the substrate was set lower than the voltage applied to the FPG under the conditions that the pressure in the chamber was 0.15 Pa in the chamber, the electric power supplied to the FPG was 300 W, and the processing gas was water vapor.

FIG. 8A shows an image obtained by measuring the contact angle of the surface of the substrate with water without performing the desorption step and the introduction step, that is, before the processing. As shown in FIG. 8A, the water dropped on the surface of the substrate before the processing was rounded. In other words, the surface of the substrate before the processing exhibited high water repellency. The contact angle of the surface of the substrate before the processing with water was larger than 90°. Further, FIG. 8B shows an image obtained by measuring the contact angle of the surface of the substrate with water after performing the desorption step and the introduction step, that is, after the processing. As shown in FIG. 8B, the water dropped on the surface of the substrate after the processing spread. In other words, the surface of the substrate after the processing exhibited high water hydrophilicity.

FIG. 8C shows a scanning electron microscope (SEM) image of the surface of the substrate before the processing. Scratches and holes generated when the fluororesin block was peeled off into a sheet shape were observed. FIG. 8D shows an SEM image of the surface of the substrate after the processing. The scratches and holes observed on the surface of the substrate before the processing disappeared, and elongated unevenness was observed. The unevenness is considered to be caused by the irradiation of the substrate with ions in the desorption step. As described above, although the surface morphology of the substrate changed greatly before and after the processing, the surface roughness of the substrate hardly changed before and after the processing.

Figure 9:
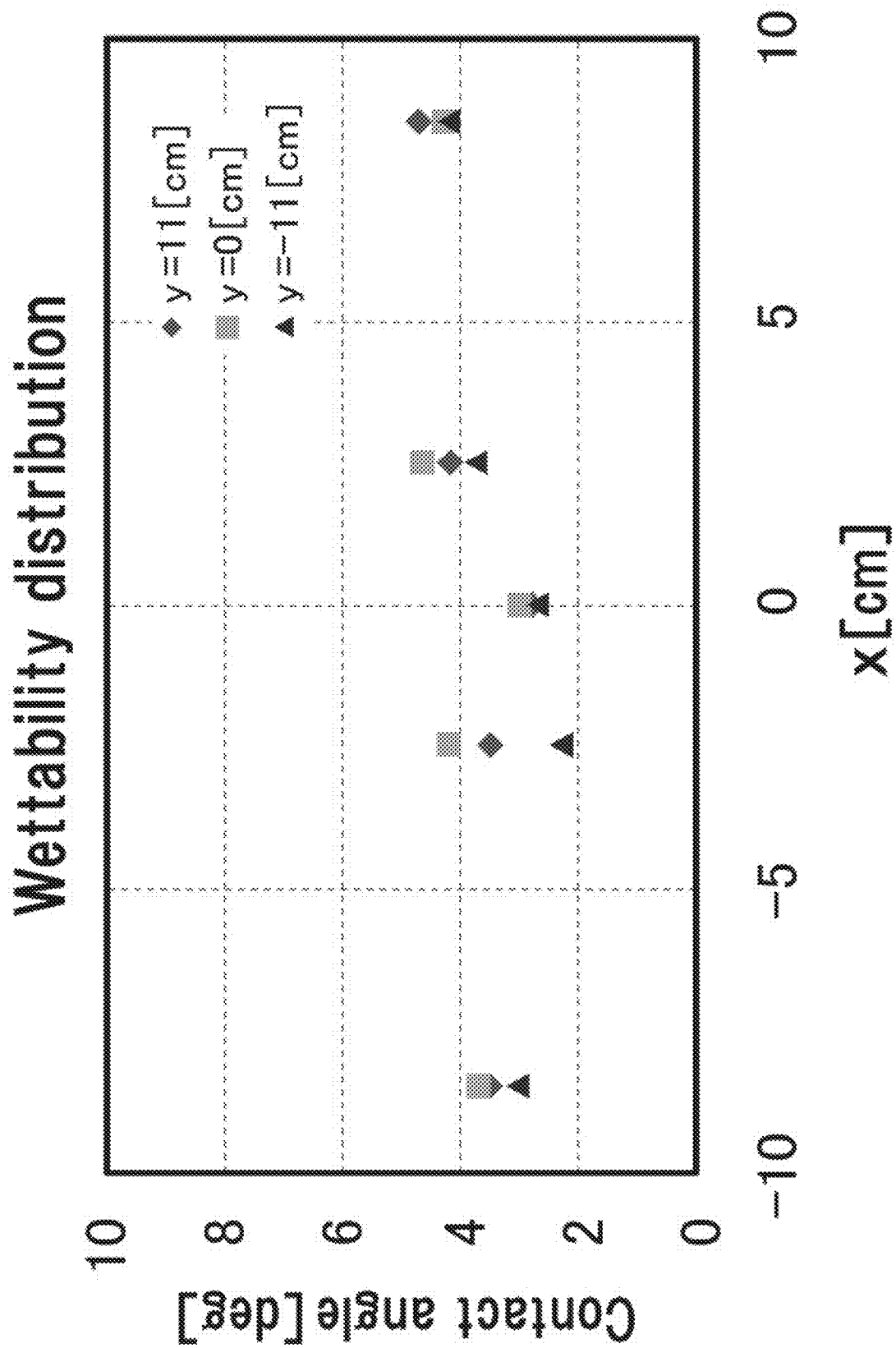
FIG. 9 is a graph showing the measurement results of contact angles of the surface of the substrate after the processing of the embodiment with water.

FIG. 9 shows the measurement result of the contact angle of the surface of the fluororesin sheet after the processing with water. The short side of the fluororesin sheet was taken as an X axis, the long side was taken as a Y axis, and the center of the fluororesin sheet was taken as a coordinate (0,0). The contact angle with water was measured at a total of 15 points including 5 points in the short side direction and 3 points in the long side direction. One point was measured twice and the mean value was plotted. The variation in the Y-axis direction was 0.3° to 1.9° at any X-axis point. Further, the variation in the X-axis direction was 1.6° to 1.9°. The contact angle was smaller than 6° at all measurement points. When the surface of the substrate after the processing was directly plated with copper, the degree of adhesion between the substrate and the copper was about 0.8 N/mm, indicating strong adhesion between the substrate and the copper.

INDUSTRIAL APPLICABILITY

The resin surface hydrophilization method, the plasma processing device, the laminate body, and the laminate body manufacturing method of the present application are used for a circuit substrate used in a mobile phone for communicating high-speed and large-capacity information. Since the relative dielectric constant of the fluororesin is lower than that of air, the fluororesin substrate is particularly suitable for a material of a high-frequency substrate. Compared with circuit substrates using other general materials, a circuit substrate using fluororesin has a low relative dielectric constant and small dielectric loss tangent even when a high frequency current flows, and has a small dielectric loss.

When the resin surface hydrophilization method of the present application is applied to a fluororesin substrate, the hydrophilicity of the substrate is improved, the adhesion with copper wiring can be improved, and a circuit substrate which can withstand use in a high frequency band can be provided. The technology applicable to the use in the high frequency band can be applied not only to the main body of the mobile phone but also to a substrate used for a base station of the mobile phone, a substrate for communication dedicated to a home, a factory, or an area, or a substrate for a millimeter wave radar used for automatic driving of an automobile, a drone, or the like, and has a wide application range.

REFERENCE SIGNS LIST

S10 Desorption step
S20 Introduction step
S30 Deposition step
S40 Coating step
1 To-be-processed member
2 Vacuum chamber
3, 12, 13, 20, 21, 42, 43, 44a, 44b, 67, 70 Fine plasma gun (FPG, Plasma irradiation source)
4 Holding base
5 Cover
6 Radical (Hydroxyl radical)
7 Ion
8 Second DC power source
9 First DC power source
10 Ground
11 Supply roller
14, 15 First holding unit
16a, 16b, 16c, 16d, 30a, 30b, 30c, 30d, 30e Resin
17 First gas introduction unit
18 Second gas introduction unit
19 Guide roller
22, 23 Second holding unit
24 Winding roller
25, 39 First chamber
31 Movable portion
32a, 32b, 32c, 32d, 32e Raceway portion
33, 34, 35, 36, 37 Gate valve
38, 41 Vacuum preliminary chamber
45a, 45b Electrode plate
62b, 62c Laminate body
65 Third chamber
68, 71 Third holding unit
66, 69 Copper target
80 Processing device
90, 95, 100, 110 Plasma processing device
91, 111 First processing device
92, 93, 101, 112 Second processing device
96 Third processing device
97, 98 Metal deposition unit

What is claimed is:

1. A plasma processing device, comprising:
a first processing device including,
a first chamber,
a first exhaust pump which provides, into the first chamber, a first pressure equal to or higher than 0.1

Pa and equal to or lower than 0.3 Pa while depressurizing the first chamber,
a first holding unit which holds resin, a first gas introduction unit which introduces, into the first chamber, first gas for desorbing at least a part of atoms constituting the resin from a surface of the resin when turned into plasma, and
a first plasma generation unit which turns the first gas into plasma at the first pressure; and a second processing device including,
a second chamber that is grounded,
a second exhaust pump which provides, into the second chamber, a second pressure equal to or higher than 30% and equal to or lower than 50% of the first pressure at which a desorption has been performed while depressurizing the second chamber,
a second holding unit which holds the resin processed in the first chamber and to which a first DC voltage is applied,
a second gas introduction unit which introduces, into the second chamber, second gas which generates hydroxyl radicals by being turned into plasma, and
a second plasma generation unit which turns the second gas into plasma at the second pressure and to which a second DC voltage higher than the first DC voltage is applied.

2. The plasma processing device according to claim 1, wherein the second holding unit includes a heating unit.

3. The plasma processing device according to claim 1, further comprising a third processing device including,
a third chamber,
a third holding unit which holds the resin processed in the second chamber, and
a metal deposition unit which deposits a metal on the resin held by the third holding unit.

4. The plasma processing device according to claim 3, wherein at least a part of an inner wall of the second chamber, the second plasma generation unit, and components installed in the second chamber, to be in contact with the plasma, is made of same metal as the metal.

* * * * *